US006896970B2

(12) United States Patent
Mayzel

(10) Patent No.: US 6,896,970 B2
(45) Date of Patent: May 24, 2005

(54) CORROSION RESISTANT COATING GIVING POLISHED EFFECT

(75) Inventor: Alexander Mayzel, Highland Heights, OH (US)

(73) Assignee: Areway, Inc., Brooklyn, OH (US)

( * ) Notice: Subject to any disclaimer, the term of this patent is extended or adjusted under 35 U.S.C. 154(b) by 469 days.

(21) Appl. No.: 09/773,233

(22) Filed: Jan. 31, 2001

(65) Prior Publication Data

US 2002/0102416 A1 Aug. 1, 2002

(51) Int. Cl.[7] .......................... B32B 15/04; C23C 16/06

(52) U.S. Cl. ....................... 428/458; 428/469; 428/470; 428/471; 428/472; 427/250; 427/255.15; 427/404; 427/405; 427/407.1; 427/409; 427/453; 427/454

(58) Field of Search ................................ 427/404, 405, 427/407.1, 409, 255.15, 250, 453, 454; 428/458, 469, 470, 471, 472

(56) References Cited

U.S. PATENT DOCUMENTS

| | | | | | |
|---|---|---|---|---|---|
| 3,991,230 | A | | 11/1976 | Dickie et al. | 427/44 |
| 4,105,821 | A | | 8/1978 | Blaich et al. | 428/215 |
| 4,358,507 | A | | 11/1982 | Senaha et al. | 428/429 |
| 4,422,886 | A | * | 12/1983 | Das et al. | 428/472.2 |
| 4,457,598 | A | | 7/1984 | Shimabukuro et al. | 350/288 |
| 4,830,873 | A | | 5/1989 | Benz et al. | 427/35 |
| 5,527,562 | A | | 6/1996 | Balaba et al. | 427/430.1 |
| 5,656,335 | A | | 8/1997 | Schwing et al. | 427/447 |
| 6,068,890 | A | | 5/2000 | Kämle et al. | 427/534 |
| 6,090,490 | A | | 7/2000 | Mokerji | 428/412 |
| 6,103,381 | A | | 8/2000 | Mokerji | 428/412 |
| 6,168,242 | B1 | | 1/2001 | Mokerji | 301/37.1 |
| 6,420,032 | B1 | * | 7/2002 | Iacovangelo | 428/412 |

* cited by examiner

*Primary Examiner*—Monique R. Jackson
(74) *Attorney, Agent, or Firm*—Renner, Otto, Boisselle & Sklar, LLP

(57) ABSTRACT

The process for coating a substrate with a coating giving a polished effect and improved corrosion resistance and coatings produced from this process. The process includes the steps of applying an atomized metal layer onto the substrate and applying a corrosion inhibiting layer to the atomized metal layer.

15 Claims, 1 Drawing Sheet

CORROSION RESISTANT COATING GIVING POLISHED EFFECT

FIELD OF THE INVENTION

This invention relates to a multi-layer coating for manufactured goods that produces a polished effect and excellent corrosion protection. The invention further relates to the process for coating a substrate to give a polished effect and corrosion resistance to the substrate. The coating can be used over metals, including steel and lightweight metals such as aluminum and aluminum alloys, as well as over plastics, glass and ceramics. Typical manufactured goods coated with the coating of the present invention may include automotive rims, radiator grids, trophies, operating buttons, light fixtures and the like. The coating is especially useful for manufactured goods that are designed for outdoor use and are subjected to corrosion attack.

BACKGROUND OF THE INVENTION

To produce a highly polished appearance on the surface of manufactured articles, thin chrome layers have been applied onto the surfaces of articles using electroplating or vacuum deposition methods. These methods, however, have significant disadvantages. Mechanical polishing of the surface of a manufactured article is generally necessary prior to the application of the chrome layer. The process of mechanical polishing can be very expensive. In addition, chrome electroplating is a multi-step process involving the use of environmentally hazardous ingredients like hexavalent chromium and cyanides.

U.S. Pat. No. 5,656,335 describes a process for coating a substrate with a metal giving a polished effect. The process consists of (1) cleaning or powder coating the surface of the substrate, (2) coating the surface with metal by plasma deposition in vacuum chamber, and (3) top coating the metal coated substrate with powder lacquer. The metal applied by plasma deposition may be aluminum, chromium, titanium, silver or gold. The powder lacquer top coat is applied directly to the metal layer. In an optional process step, a carbon compound that is highly resistant to scratching may be applied to the top coat.

U.S. Pat. No. 6,068,980 describes a method for gloss coating articles that includes the steps of (1) applying a chromate layer onto the surface of the substrate; (2) applying a powdered paint layer to the chromate layer, (3) applying a corrosion inhibiting base coat to the powdered paint layer; (4) applying a high gloss metal layer using a magneto in a vacuum to the corrosion inhibiting base coat and (5) applying a transparent wear-resistant top coat to the high-gloss metal layer. The corrosion inhibiting base coat is disclosed as being made for example from a powdered baking finish or a sputtered paint and applied in a known fashion. The top coat is disclosed as being an organic-inorganic compound such as organically modified ceramic (ORMOCER), or an organic coating based on acrylates, polyurethane or epoxy resin. The gloss of the top coat may be adjusted with pigments.

The thin metal layer used to produce the polished effect in the prior methods is protected from the environment by only the top coat. In general, the topcoat is a transparent paint with a thickness up to 100 microns. The top coat does not provide adequate corrosion protection to the underlying metal layer.

SUMMARY OF THE INVENTION

The present invention is directed to a process for coating a substrate giving a polished effect and improved corrosion protection, comprising the steps of: (a) applying a polymeric coating over the substrate; (b) applying at least one atomized metal over the polymeric coating to form a metal layer; (c) applying a corrosion inhibiting inorganic coating to the metal layer; and (d) applying a transparent top coating over the corrosion inhibiting inorganic coating to form a protective layer.

The present invention is further directed to a process for coating a metal substrate giving a polished effect, comprising the steps of: (a) applying a first corrosion inhibiting inorganic coating to the substrate; (b) applying a polymeric coating over the first corrosion inhibiting inorganic coating; (c) applying at least one atomized metal over the polymeric coating to form a metal layer; (d) applying a second corrosion inhibiting inorganic coating to the metal layer; and (e) applying a transparent top coating over the second corrosion inhibiting inorganic coating to form a protective layer. The first and second corrosion inhibiting inorganic coatings may be the same or different.

The multi-layer coating on the present invention gives a polished effect for the surface of an article of manufacture and improved corrosion protection. The coating comprises: (a) a polymeric layer overlying the surface of the article; (b) a metal layer overlying the polymeric layer comprising at least one atomized metal; (c) a corrosion inhibiting inorganic layer overlying the metal layer; and (d) a transparent top coat layer overlying the corrosion inhibiting inorganic layer. If the article has a metal surface, the coating may further comprise another corrosion inhibiting inorganic layer underlying the polymeric layer.

BRIEF DESCRIPTIONS OF THE DRAWINGS

DESCRIPTION OF THE PREFERRED EMBODIMENTS

The term "overlies" and cognate terms such as "overlying" and the like, when referring to the relationship of one or a first layer relative to another or a second layer, refers to the fact that the first layer partially or completely lies over the second layer. The first layer overlying the second layer may or may not be in contact with the second layer. For example, one or more additional layers may be positioned between the first layer and the second layer. The term "underlies" and cognate terms such as "underlying" and the like have similar meanings except that the first layer partially or completely lies under, rather than over, the second layer.

Figure 1:
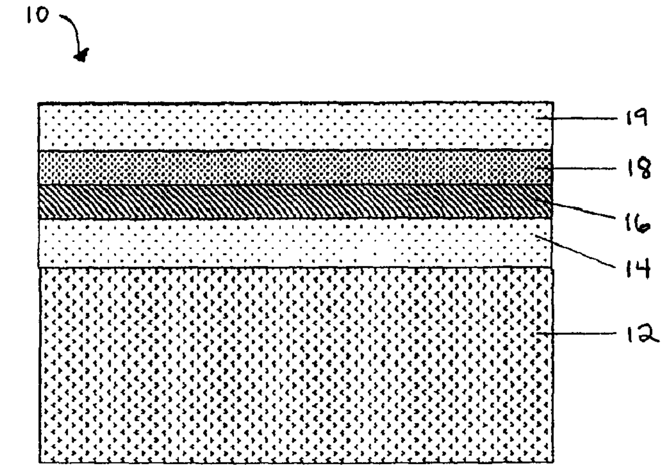
FIG. 1 is a cross section view of a substrate coated with the multi-layer coating of the present invention.

Referring to FIG. 1, a coated manufacturing article 10, in one embodiment, includes substrate 12, which is made of a metal, metal alloy, glass, plastic or ceramic. A polymeric coating 14 is coated onto substrate 12 to smooth out the surface of substrate 12. A thin metal layer 16 is applied in atomized form onto polymeric coating 14. Outer corrosion inhibiting layer 18 is coated onto thin metal layer 16 to provide corrosion protection to metal layer 16. Top coat 19 is applied to outer corrosion inhibiting layer 18.

Figure 2:
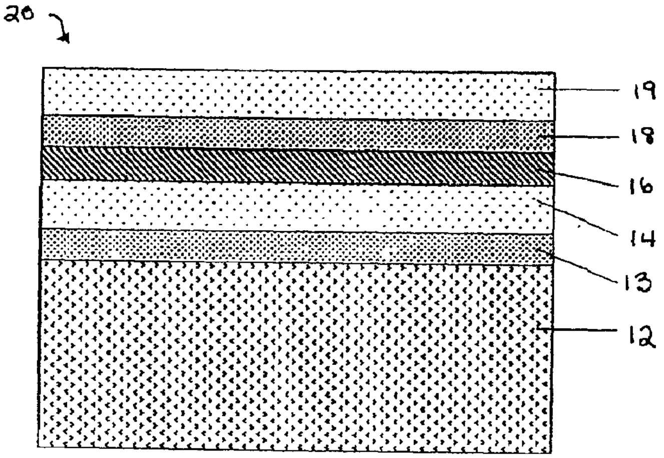
FIG. 2 is a cross section view of a substrate coated with the multi-layer coating of the present invention, including an outer corrosion inhibiting layer and a base corrosion inhibiting layer.

In another embodiment, illustrated in FIG. 2, a coated manufacturing article 20 includes substrate 12, which is made of a metal or metal alloy. Onto metal substrate 12 is coated a base corrosion inhibiting layer 13 to provide corrosion protection to the underlying metal substrate 12. A polymeric coating 14 is coated onto corrosion inhibiting layer 13 to smooth out the surface of the article. A thin metal layer 16 is applied in atomized form onto polymeric coating 14. Outer corrosion inhibiting layer 18 is coated onto thin metal layer 16 to provide corrosion protection to metal layer 16. Top coat 19 is applied to outer corrosion inhibiting layer 18.

Figure 3:
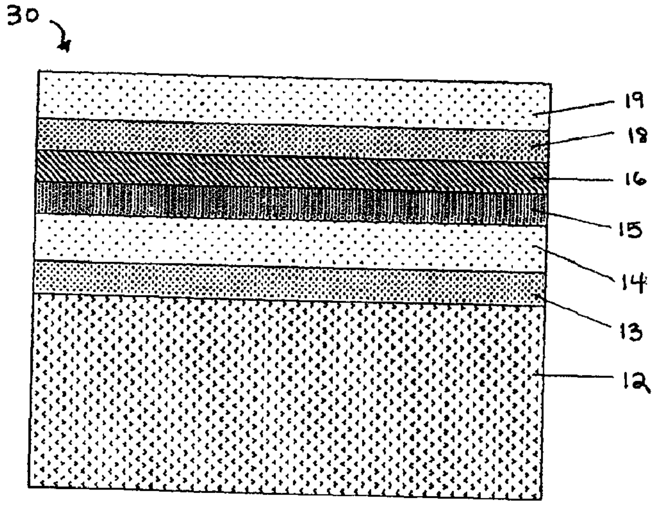
FIG. 3 is a cross section view of a substrate coated with the multi-layer coating of the present invention, including an adhesion promoting layer.

In yet another embodiment, illustrated in FIG. 3, a coated manufacturing article 30 includes substrate 12, which is made of a metal or metal alloy. Onto metal substrate 12 is coated a base corrosion inhibiting layer 13 to provide corrosion protection to the underlying metal substrate 12. A polymeric coating 14 is coated onto corrosion inhibiting layer 13 to smooth out the surface of the article. Adhesion promoting layer 15 is applied to polymeric coating 14. A thin metal layer 16 is applied in atomized form onto to adhesion promoting layer 15. Outer corrosion inhibiting layer 18 is coated onto thin metal layer 16 to provide corrosion protection to metal layer 16. Top coat 19 is applied to outer corrosion inhibiting layer 18.

Each of corrosion inhibiting layers 13 and 18 may independently be at least one oxide or salt of at least one of the metals aluminum, cadmium, cobalt, cesium, manganese, molybdenum, nickel, silicon, titanium, zinc and zirconium. The protective layer can be applied from a solution of an appropriate salt. Examples of such inorganic corrosion inhibiting layers include cobalt, zirconium and manganese conversion coatings. Such conversion coatings are commercially available. Examples of zirconium conversion coatings include those described in U.S. Pat. Nos. 6,087,017 and 4,422,886, incorporated herein by reference. Examples of cobalt conversion coatings include those described in U.S. Pat. Nos. 5,873,953 and 5,415,687, incorporated herein by reference. Application of these conversion coatings results in sedimentation of salts or oxides of these metals on the surface of the substrate or underlying metal. The conversion coating may also contain some level of salts and oxides of the substrate or underlying metal. Many chromate-free chemical conversion coatings for metal surfaces are known to the art. These are designed to render a metal surface "passive" (or less "reactive" in a corrosive environment), leaving the underlying metal protected from the environment. Coatings of this type that produce a corrosion resistant outer layer on the base metal or its oxide often simultaneously produce a surface with improved paint adhesion. Conversion coatings may be applied by a no-rinse process, in which the substrate surface is treated by dipping, spraying, or roll coating. The coatings may also be applied in one or more stages that are subsequently rinsed with water to remove undesirable contaminants. In general, it is preferable that the process of applying corrosion inhibiting layer 18 does not include pickling, acid activation or other steps that may contribute to thickening of the underlying thin metal layer.

Polymeric coating 14 can be applied by any appropriate method including dipping, liquid spraying, powder spraying or electro-coating. The purpose of the polymeric coating is to level off the surface of the substrate and smooth out all defects, scratches, deformations, etc. Particularly useful polymeric coatings produce a very smooth surface and fill in all irregularities. To produce a high quality finished product, it is important that the surface of the polymeric coating has no long wave orange peel or no short wave texturing that would telegraph through the rest of the coating. The polymeric coating can be of any chemistry and composition, but preferably of ones that provide corrosion protection to the substrate. In one embodiment, the polymeric coating contains pigments and/or fillers to enhance corrosion protection. In one embodiment, the polymeric coating is an epoxy powder coating.

Metal layer 16 is applied in atomized form over the polymeric coating. Methods of metal application can include plasma vapor deposition, chemical vapor deposition, and thermal deposition. In each of these methods, a target metal is atomized by heating, by means of electric discharge, or by other methods. Atoms of the metal are carried to the coated surface of the article and settle there, resulting in a layer of metal with a thickness between 0.1 and 3 microns. The metal layer adheres to the underlying polymeric coating and has a bright and shiny appearance. Depending on the desired outcome, the choice of target metals may include, but is not limited to, aluminum, nickel, chromium, titanium, zirconium, silver and gold and combinations thereof. In one embodiment, aluminum is used as the target metal, resulting in a metal layer having a polished and highly reflective appearance that resembles chrome plating.

To ensure good adhesion between the polymeric coating and the atomized metal layer, an adhesion promoting layer 15 may be applied over the polymeric layer before application of the metal. This adhesion promoting layer may be applied by spraying or dipping, followed by drying in an oven.

A top coat 19 may be an organic, ceramic, or an organically modified ceramic transparent coating applied using liquid spray, powder spray, electro-coat or dip methods. An ormocer typically comprises a polar component, a hydrophobic component and micro-ceramic particles. The polar component provides good adhesion of the ormocer to the underlying layer. The hydrophobic component, which may be a fluorinated material, is preferably orientated to the air-coating interface so as to impart non-stick properties at the coating surface. The micro-ceramic particles impart abrasion resistance and anti-scratch properties. In one embodiment, the top coating is an organopolysiloxane coating.

EXAMPLE

A cast aluminum automotive wheel rim is coated using the multi-layer coating of the present invention. A zirconium conversion coating is first applied to the surface of the rim. After the conversion coating is dried, the rim is powdered coated with an epoxy-hybrid powder primer and the primer coating is baked for 20 minutes at 350° F. to produce a smooth surface. The rim is then spray coated with liquid adhesion promoting paint and baked for 15 minutes at 350° F. Pure aluminum is applied over the surface of the rim using thermal evaporation in high vacuum to obtain a polished appearance Following application of the metal layer, a zirconium conversion coating is applied to the surface of the metal layer and the excess liquid is drained off. Finally, a powdered clear topcoat is applied over the rim and baked in an oven for 20 minutes at 365° F. The finished rim has a very shiny and smooth surface that resembles chrome plating. The multi-layer coating passes cross-hatch adhesion testing, 1000 hours neutral salt spray corrosion testing with no damage to the coating and 168 hours CASS corrosion testing with less than 4 mm adhesion loss from the cut.

While the invention has been explained in relation to its preferred embodiments, it is to be understood that various modifications thereof will become apparent to those skilled in the art upon reading the specification. Therefore, it is to be understood that the invention discloses herein is intended to cover such modifications as fall within the scope of the appended claims.

What is claimed is:

1. A multi-layer coating having a polished effect for the surface of an article of manufacture, the multi-layer coating comprising: a polymeric layer overlying the surface of the article; a metal layer overlying the polymeric layer comprising at least one atomized metal; a corrosion inhibiting inorganic layer overlying the metal layer, wherein the corrosion inhibiting inorganic layer is a conversion coating; and a transparent top coat layer overlying the corrosion inhibiting inorganic layer.

2. The multi-layer coating of claim 1 wherein the corrosion inhibiting inorganic layer is selected from the group consisting of one or more oxide, salt, and combination thereof of a metal selected from the group consisting of aluminum, cadmium, cobalt, cesium, copper, manganese, molybdenum, nickel, silicon, titanium, zinc, and zirconium.

3. The multi-layer coating of claim 1 wherein the top coat layer comprises an organic coating.

4. The multi-layer coating of claim 1 wherein the top coat layer comprises a ceramic coating.

5. The multi-layer coating of claim 1 wherein the top coat layer comprises an organopolysiloxane coating.

6. The multi-layer coating of claim 1 further comprising an adhesion promoting layer between the polymeric layer and the metal layer.

7. A multi-layer coating having a polished effect for the surface of an article of manufacture, the multi-layer coating comprising: a first corrosion inhibiting inorganic coating overlying the surface of the article; a polymeric layer overlying the first corrosion inhibiting inorganic coating; a metal layer overlying the polymeric layer comprising at least one atomized metal; a second corrosion inhibiting inorganic layer overlying the metal layer; and a transparent top coat layer overlying the corrosion inhibiting inorganic layer; wherein the first and second corrosion inhibiting inorganic coatings may be the same or different.

8. The multi-layer coating of claim 7 wherein the first and second corrosion inhibiting inorganic coatings are independently selected from the group consisting of one or more oxide, salt, and combination thereof of a metal selected from the group consisting of aluminum, cadmium, cobalt, cesium, copper, manganese, molybdenum, nickel, silicon, titanium, zinc, and zirconium.

9. The multi-layer coating of claim 7 wherein the top coat layer comprises an organic coating.

10. The multi-layer coating of claim 7 wherein the top coat layer comprises a ceramic coating.

11. The multi-layer coating of claim 7 wherein the top coat layer comprises an organopolyslioxane coating.

12. The multi-layer coating of claim 7 further comprising an adhesion promoting layer between the polymeric coating and the metal layer.

13. The multi-layer coating of claim 7 wherein the first corrosion inhibiting inorganic layer is a conversion coating.

14. The multi-layer coating of claim 7 wherein the second corrosion inhibiting inorganic layer is a conversion coating.

15. The multi-layer coating of claim 7 wherein both the first corrosion inhibiting inorganic layer and the second corrosion inhibiting inorganic layer are conversion coatings.

* * * * *